United States Patent
Hild et al.

(10) Patent No.: US 10,146,138 B2
(45) Date of Patent: Dec. 4, 2018

(54) METHOD FOR PRODUCING AN OPTICAL ELEMENT FOR AN OPTICAL SYSTEM, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Kerstin Hild, Schwaebisch Gmuend (DE); Franz-Josef Stickel, Aalen-Unterrombach (DE); Robert Fichtl, Aalen (DE); Joachim Hartjes, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/649,097

(22) Filed: Jul. 13, 2017

(65) Prior Publication Data
US 2017/0315452 A1  Nov. 2, 2017

Related U.S. Application Data

(63) Continuation of application No. PCT/EP2015/081434, filed on Dec. 30, 2015.

(30) Foreign Application Priority Data

Jan. 13, 2015 (DE) .......... 10 2015 200 328

(51) Int. Cl.
*G03F 7/20* (2006.01)
*G21K 1/06* (2006.01)
(Continued)

(52) U.S. Cl.
CPC ......... *G03F 7/70266* (2013.01); *G02B 26/06* (2013.01); *G02B 27/0068* (2013.01);
(Continued)

(58) Field of Classification Search
CPC ............ G03F 7/70266; G03F 7/70958; G03F 7/70316
(Continued)

(56) References Cited

U.S. PATENT DOCUMENTS 6,844,272 B2  1/2005  Taylor et al.
7,429,116 B2  9/2008  Mann et al.
(Continued)

FOREIGN PATENT DOCUMENTS

DE       10317662 A1    11/2004
DE    102004051838 A1    5/2005
(Continued)

OTHER PUBLICATIONS

Office Action in corresponding German Application 102015200328.0, dated Jul. 21, 2015, along with English Translation.
(Continued)

*Primary Examiner* — Hung Nguyen
(74) *Attorney, Agent, or Firm* — Edell, Shapiro & Finnan, LLC

(57) ABSTRACT

A method for producing an optical element includes: providing a substrate (102), applying a layer system (103), wherein an optically effective surface (101) is formed and wherein the layer system has a layer (104) that is thermally deformable for manipulating the geometric shape of the optically effective surface, and applying a temperature field to the optical element while at least regionally heating the thermally deformable layer to above a specified operating temperature of the optical system. The thermally deformable layer is configured such that a deformation that is induced when the temperature field is applied is at least partially maintained after the optical element has cooled. Also disclosed is an optical element (400) that has an optically effective surface (401), a substrate (402), and a layer system
(Continued)

(403) that has a reflection layer system (406), which includes a shape-memory alloy.

15 Claims, 6 Drawing Sheets

(51) Int. Cl.
*G02B 27/00* (2006.01)
*G02B 26/06* (2006.01)

(52) U.S. Cl.
CPC ...... *G03F 7/70316* (2013.01); *G03F 7/70958* (2013.01); *G21K 1/062* (2013.01); *G21K 2201/067* (2013.01)

(58) Field of Classification Search
USPC .......................................................... 355/67
See application file for complete search history.

(56) References Cited

U.S. PATENT DOCUMENTS

| | | |
|---|---|---|
| 9,063,277 B2 | 6/2015 | Masaki et al. |
| 2002/0050045 A1 | 5/2002 | Chiodo et al. |
| 2006/0018045 A1 | 1/2006 | Moeller et al. |
| 2012/0113497 A1 | 5/2012 | Woias et al. |
| 2014/0285783 A1 | 9/2014 | Dinger et al. |
| 2015/0043060 A1 | 2/2015 | Huber et al. |
| 2015/0168674 A1 | 6/2015 | Bittner et al. |
| 2016/0377988 A1 | 12/2016 | Paul et al. |

FOREIGN PATENT DOCUMENTS

| | | | |
|---|---|---|---|
| DE | 10360414 A1 | 7/2005 | |
| DE | 102005044716 A1 * | 9/2005 | ............... G02B 1/00 |
| DE | 102005044716 A1 | 4/2007 | |
| DE | 102009018365 A1 | 11/2010 | |
| DE | 102011090192 A1 | 7/2012 | |
| DE | 102011076014 A1 | 8/2012 | |
| DE | 102011005940 A1 | 9/2012 | |
| DE | 102011084649 A1 | 4/2013 | |
| DE | 102012207003 A1 | 10/2013 | |
| DE | 102013206981 A1 | 12/2013 | |
| DE | 102012212898 A1 | 1/2014 | |
| DE | 102014204171 A1 | 9/2015 | |
| DE | 102014224569 A1 | 6/2016 | |
| DE | 102016201445 A1 | 2/2017 | |
| EP | 2422125 B1 | 2/2012 | |
| WO | 2007033964 A1 | 3/2007 | |
| WO | 2011020655 A1 | 2/2011 | |
| WO | 2013057046 A1 | 4/2013 | |
| WO | 2016087092 A1 | 6/2016 | |

OTHER PUBLICATIONS

International Search Report and Written Opinion in counterpart International Application No. PCT/EP2015/081434, dated Jul. 18, 2017, 9 pages; with English Translation.
Baomin Wang et al: "Exchange Bias and Inverse Magnetocaloric Effect in Co and MnCo-Doped Ni2MnGa Shape Memory Alloy", Metals, vol. No. 1, Jan. 25, 2013, pp. 69-76, XP055265644, DOI: 10.3390/met3010069, pp. 69, 70.
International Preliminary Report on Patentability and Written Opinion in counterpart International Application No. PCT/EP2015/081434, dated Apr. 29, 2016.
C. Bechtold et al.: High cyclic stability of the elastocaloric effect in sputtered TiNiCu shape memory films, Appl. Phys. Lett., 101, 091903 (2012).
Wang et al., "Exchange Bias and Inverse Magnetocaloric Effect in Co and Mn Co-Doped Ni2MnGa Shape Memory Alloy", Metals, vol. 3, No. 1, Jan. 25, 2013, pp. 69-76.
International Search Report in counterpart International Application No. PCT/EP2015/081434, dated Apr. 29, 2016, with English translation, 6 pages.

\* cited by examiner

METHOD FOR PRODUCING AN OPTICAL ELEMENT FOR AN OPTICAL SYSTEM, IN PARTICULAR FOR A MICROLITHOGRAPHIC PROJECTION EXPOSURE APPARATUS

CROSS REFERENCE TO RELATED APPLICATIONS

The present application is a Continuation of International Application No. PCT/EP2015/081434, filed Dec. 30, 2015, which claims the priority under 35 U.S.C. § 119(a) to German Patent Application DE 10 2015 200 328.0, filed on Jan. 13, 2015. The disclosures of both related applications are considered part of and are incorporated by reference into the disclosure of the present application in their respective entireties.

FIELD OF THE INVENTION

The invention relates to a method for producing an optical element of an optical system, in particular for a microlithographic projection exposure apparatus.

BACKGROUND

Microlithography is used for producing microstructured components such as, for example, integrated circuits or LCDs. The microlithography process is carried out in a so-called projection exposure apparatus comprising an illumination device and a projection lens. The image of a mask (reticle) illuminated by way of the illumination device is in this case projected by means of the projection lens onto a substrate (for example a silicon wafer) that is coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

One problem that arises in practice is that the EUV mirrors can have production-related geometric shape deviations of their optical effective surface (also referred to as shape accuracy errors) after their production or after the coating process has been effected, and these shape deviations can lead to a negative influence on the imaging properties of the optical system unless they are corrected.

In order to permit the correction of such effects, and also to change the optical properties of a mirror in a targeted fashion, e.g. for compensating aberrations occurring in the system, it is known to control mirror deformations during the operation of the optical system by way of e.g. thermal actuation. However, such corrective measures are frequently complicated and can furthermore prove to be no longer sufficient in the case of increasing demands in terms of the accuracy of the wavefront to be set in the optical system.

Regarding the prior art, reference is made merely by way of example to WO 2007/033964 A1, DE 103 60 414 A1 and DE 10 2004 051 838 A1.

SUMMARY

It is an object of the present invention to provide a method for producing an optical element for an optical system, in particular for a microlithographic projection exposure apparatus, which permits increased accuracy of the wavefront set in the optical system with reduced layout in terms of construction.

This object is achieved by way of the method in accordance with the features of the independent patent claims.

According to one aspect, a method according to the invention for producing an optical element for an optical system, in particular for a microlithographic projection exposure apparatus, has the following steps:

providing a substrate;

applying a layer system onto the substrate, wherein an optically effective surface of the optical element is formed and wherein the layer system has a layer that is thermally deformable for manipulating the geometric shape of the optically effective surface; and applying a temperature field to the optical element while at least regionally heating the thermally deformable layer to above a specified operating temperature of the optical system;

wherein, before the temperature field is applied to the optical element, the thermally deformable layer is configured such that a deformation that is induced when the temperature field is applied is at least partially maintained after the optical element has cooled to the specified operating temperature.

According to one embodiment, the thermally deformable layer has a phase transition, wherein this phase transition has a hysteresis profile in the temperature dependence of the layer thickness of the thermally deformable layer such that any active deformation that is achieved by applying the temperature field to the optical element is maintained even if the relevant temperature required for the layer thickness change no longer prevails.

The invention is based in particular on the concept of implementing in an optical element, even before it is mounted in the optical system, a (e.g. one-time) correction of a production-related geometric shape deviation of the optically effective surface by way of a thermally deformable layer, which is incorporated in a layer system of the optical element for the single purpose of this correction, being actively deformed by the application of a temperature field to the optical element, specifically in a way such that the induced deformation at least partially is maintained (that is to say remains "frozen," as it were) after once again cooling the optical element or during later operation in the optical system at its operating temperature.

In order to ensure that the induced deformation is maintained during the operation of the optical system, a suitable prior configuration of the optical system ensures that ideally no layer thickness change occurs in the relevant operating temperature range, that is to say in particular a phase transition that is responsible for the layer thickness change, as will be described below, does not take place in the relevant operating temperature range.

The invention here proceeds from the finding that, with a suitable configuration of the thermally deformable layer, a hysteresis profile that describes said phase transition, in the dependence "layer thickness vs. temperature" is such that any active deformation that is obtained by applying a temperature field to the optical element is maintained even if the relevant temperature that is necessary for a layer thickness change no longer prevails. Consequently, a shape error or shape accuracy error that is ascertained after production of the optical element can be corrected even before the element is mounted in the relevant optical system by way of a single application of a temperature field that has been calculated in a targeted fashion, wherein the corrected geometric shape of the optically effective surface of the element that is set here is maintained as a consequence of the suitable configuration of the thermally deformable layer, which was done previously, even during later operation of the optical system at operating temperature.

Furthermore, the invention utilizes the finding that the previously described concept of a correction of the geometric shape of the optically effective surface by way of a thermally deformable layer which is incorporated in the layer system, while utilizing a phase transition that is describable by way of a hysteresis in the dependence "layer thickness vs. temperature" has proven effective even in the case of relatively large substrate thicknesses (e.g. of several hundred micrometers (μm)), wherein, merely by way of example, layer thickness changes of a few 10 nm are attainable.

According to one aspect, a method according to the invention for producing an optical element for an optical system, in particular for a microlithographic projection exposure apparatus, has the following steps:
providing a substrate;
applying a layer system onto the substrate, wherein an optically effective surface of the optical element is formed and wherein the layer system has a layer that is thermally deformable for manipulating the geometric shape of the optically effective surface; and
applying a temperature field to the optical element while at least regionally heating the thermally deformable layer to above a specified operating temperature of the optical system;
wherein the thermally deformable layer has a phase transition, wherein this phase transition has a hysteresis profile in the temperature dependence of the layer thickness of the thermally deformable layer such that any active deformation that is achieved by applying the temperature field to the optical element is maintained even if the relevant temperature required for the layer thickness change no longer prevails.

According to one embodiment, the temperature field applied to the optical element varies locally.

According to a further embodiment, the temperature field applied to the optical element is homogeneous.

According to one embodiment, the thermally deformable layer is configured such that an error in the optical system (e.g. an optical aberration or an imaging error of the overall system) is at least partially corrected by way of the deformation that is induced when the temperature field is applied. If, for example, an error of the entire optical system is known in advance or before the optical element is produced, it is possible to work a corresponding locally varying doping into the thermally deformable layer or to perform a locally varying post-treatment (e.g. by tempering or applying a magnetic field) on the layer, wherein the desired correction can then also be attained by applying a homogeneous temperature field. Different possibilities for configuring the thermally deformable layer, e.g. by doping or by way of an external magnetic field, will be explained in more detail below.

According to one embodiment, the thermally deformable layer is made of a material which has, in dependence on the temperature, a phase transition between a martensite phase and an austenite phase.

According to one embodiment, configuring the thermally deformable layer comprises actively cooling the thermally deformable layer to below a saturation temperature for the martensite phase.

According to one embodiment, the thermally deformable layer is made from a Heusler alloy. The Heusler alloy can be selected in particular from the group containing nickel manganese gallium and nickel titanium.

The layer can have e.g. a layer thickness in the range between 100 and 500 nm, in particular in the range 100-300 nm. A desired layer thickness change can lie e.g. in the range 1%-2%.

The invention here furthermore utilizes the finding that the principle according to the invention, which will be explained in more detail below, of using a phase transition between a martensite phase and an austenite phase that takes place, for example, in the case of a Heusler alloy in dependence on the temperature, can also be realized in the form of a thermally deformable layer made of a polycrystalline material, which is relevant to the extent that typically, for example in the case of mirrors used in the projection lens of a microlithographic projection exposure apparatus, the substrate materials used there do not allow the application of a monocrystalline layer, for example of a Heusler alloy.

The configuration of the thermally deformable layer according to the invention can, as will be explained in more detail below, comprise in particular a suitable material selection, mixture and post-treatment. As a result, advantage is taken of the fact that, with respect to the phase transition that is describable by a hysteresis in the dependence "layer thickness vs. temperature"—in particular between a martensite phase occurring at relatively low temperatures and an austenite phase occurring at relatively high temperatures—both the use temperature and the saturation temperature of the transition into the relevant phase can be manipulated by the previously mentioned measures and the measures that will be described below.

For example, it is possible by way of suitable configuration to ensure that the values both of the use temperature and of the saturation temperature for the respective transition into the relevant phase for the martensite phase or the austenite phase can be set in the range of −10° C. to 10° C. or 80° C. to 200° C., that is to say in ranges that can typically no longer be achieved during later operation of the optical system (the operating temperature of which in the case of a microlithographic projection exposure apparatus can be e.g. approximately 50° C.) by the respective optical element.

In accordance with one embodiment, the method further comprises the following step before the application of the temperature field: ascertaining a geometric shape deviation that the optically effective surface has from a specified specification at a specified operating temperature, wherein the temperature field after ascertainment of the shape deviation is of a nature such that a deformation of the thermally deformable layer that is induced hereby effects at least partial compensation of the ascertained shape deviation.

According to one embodiment, applying the temperature field to the optical element is performed before the latter is mounted in the optical system for the one-time correction of a production-related shape deviation.

According to one embodiment, configuring the thermally deformable layer comprises targeted changing of the material composition of the thermally deformable layer, in particular by way of doping.

According to one embodiment, configuring the thermally deformable layer comprises applying an external magnetic field.

According to one embodiment, configuring the thermally deformable layer comprises performing a tempering process. Tempering can be effected in particular directly after coating at temperatures between 400° C.-700° C., in particular temperatures around 500° C.

According to one embodiment, the thermally deformable layer is applied immediately on the substrate.

According to one embodiment, the optical element is a mirror.

In accordance with one embodiment, the optical element is designed for an operating wavelength of less than 30 nm, in particular less than 15 nm.

The invention furthermore relates to an optical element for an optical system, in particular a microlithographic projection exposure apparatus, wherein the optical element has an optically effective surface, having a substrate; and a layer system disposed on the substrate, wherein the layer system has a layer that is thermally deformable for manipulating the geometric shape of the optically effective surface such that, by applying a temperature field to the optical element, a deformation of the thermally deformable layer is inducible as the optical element heats to above a specified operating temperature;

wherein the thermally deformable layer is configured such that this deformation is at least partially maintained after repeat cooling of the optical element to the specified operating temperature.

With respect to further preferred configurations or advantages of the element, reference is made to the above statements in connection with the method according to the invention.

According to a further aspect, the invention also relates to an optical element for an optical system, in particular a microlithographic projection exposure apparatus, wherein the optical element has an optically effective surface, having a substrate; and a layer system that is disposed on the substrate and has a reflection layer system;

wherein the layer system furthermore has a shape-memory alloy.

According to this aspect, the present invention includes the concept of compensating for surface deformations that occur during the operation of an optical element (which can be e.g. thermally induced or can be caused in another way, for example as a result of mechanical stresses related to the mount) by way of adding a shape-memory alloy to the layer system formed on the substrate of the optical element (including a reflection layer system). The presence of this shape-memory alloy makes it possible to reverse said undesired surface deformation partially or completely by way of introducing heat into the shape-memory alloy.

This takes advantage of the fact that the shape-memory alloy "remembers" as it were its earlier given shape (i.e. before the undesired surface deformation), with the result that in the ideal case, the original shape of the shape-memory alloy or of the layer system and thus the optically effective surface can be restored completely, except for any residual errors, by way of said heat introduction into the shape-memory alloy according to the invention, which is actively brought about as a reaction to the occurrence of the surface deformation.

According to one embodiment, the shape-memory alloy includes a titanium nickel alloy, a titanium nickel copper alloy or a titanium nickel palladium alloy.

According to one embodiment, the shape-memory alloy is configured in the form of a structured layer that is formed in the layer system only in a zone-wise fashion.

The invention furthermore relates to an optical system, in particular an illumination device or a projection lens of a microlithographic projection exposure apparatus, having an optical element having the above-described features.

In embodiments of the invention, a deformation of the optically effective surface of the optical element that occurs during the operation of the optical system is here able to be at least partially compensated for by the active introduction of thermal energy into the shape-memory alloy.

In embodiments of the invention, a wavefront disturbance which is present at another location in the optical system is able to be at least partially compensated for by the active introduction of thermal energy into the shape-memory alloy. The optical element having the shape-memory alloy according to the invention can thus also be used as a correction element to actively compensate for a wavefront disturbance that is present at another location in the optical system or to contribute to a total correction of the system by way of targeted setting of a specific deformation.

According to one embodiment, the deformation of the optically effective surface of the optical element has an extent in a lateral plane, with respect to the optically effective surface, of at least 1 mm$^2$ (in this sense it is a comparatively long-wave deformation).

According to one embodiment, the deformation of the optically effective surface of the optical element has, in a direction perpendicular to the optically effective surface, a value or an extent in the range of (0.01 to 30) μm.

Further configurations of the invention can be gathered from the description and the dependent claims.

The invention is explained in greater detail below on the basis of exemplary embodiments illustrated in the accompanying figures.

DETAILED DESCRIPTION

Figure 1:
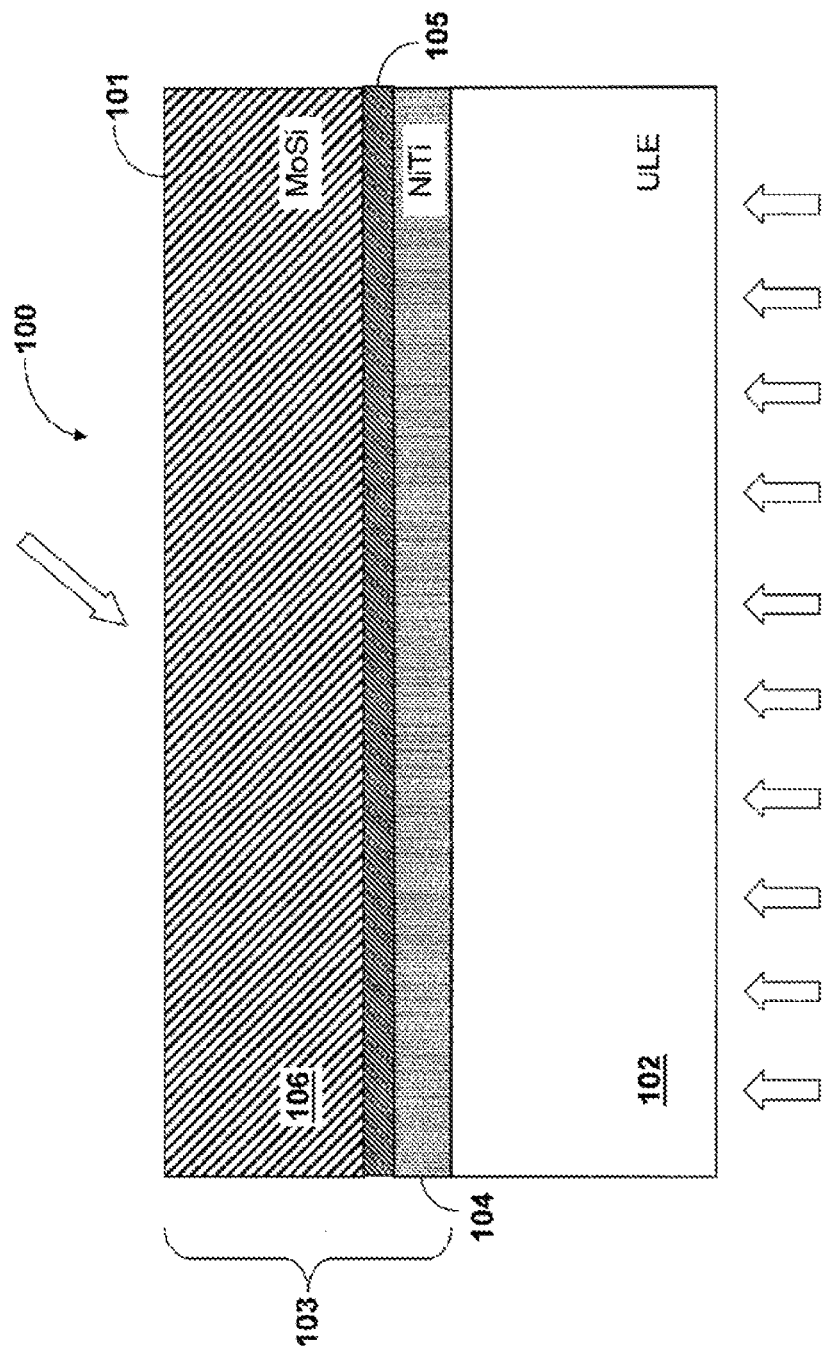
FIG. 1 shows a schematic illustration of the possible construction of an optical element according to one embodiment of the invention.

Furthermore, initially with reference to FIG. 1, one possible construction of an optical element in the form of a mirror is explained by way of a first embodiment of the invention.

In accordance with the schematic illustration of FIG. 1, an optical element 100 in the form of an EUV mirror having an optically effective surface that is designated "101," has, on a substrate 102, a layer system 103 that has, among other things, a reflection layer system 106 which can be made in a known manner and merely by way of example from a succession of molybdenum (Mo) and silicon (Si) layers. "105" denotes a substrate protection layer which serves for protecting, among others, the substrate 102 against an ingress of EUV photons. Moreover, functional layers (e.g. adhesion layers, anti-stress layers etc.) can be present in a known manner in the layer system 103.

Incorporated in the layer system 103 is, according to the invention, a thermally deformable layer 104 that is applied over the substrate 102 (e.g. by magnetron sputtering) and is here likewise protected against the ingress of EUV photons by the substrate protection layer 105. For reasons of layer adhesion, for example, a further adhesion-promoting layer can be present between the thermally deformable layer 104 and the substrate 102.

According to one embodiment, the thermally deformable layer 104 is made of a material which has, in dependence on the temperature, a phase transition between a martensite phase and an austenite phase, as will be described in more detail below with reference to FIG. 2.

This phase transition is now used according to the invention to correct a production-related shape deviation of the optically effective surface 101 retrospectively (with respect to the coating process) after production of the optical element 100, and yet before the optical element 100 is mounted in the optical system (e.g. in the projection lens of a microlithographic projection exposure apparatus described with reference to FIG. 4), specifically by applying a locally varying temperature field to the optical element 100 that causes, with utilization of the phase transition that occurs in the thermally deformable layer 104, a layer thickness change, which locally varies and is dependent on this temperature field, and thus a manipulation of the geometric shape of the optically effective surface 101 that corresponds thereto.

The temperature field can be applied, e.g. by introducing infrared radiation by way of an IR laser arrangement, where it is advised to ensure that the setting of the relevant temperature is effected as quickly as possible in the individual zones of the optical element to which different temperatures are to be applied depending on the desired layer thickness change, in other words that the temperature gradient resulting from the different temperatures is set immediately, if possible, and in particular is implemented faster than the heat dissipation that occurs between the respective zones can bring about a significant temperature equalization.

After the temperature field is removed, after the optical element 100 has cooled again, the layer thickness change of the deformable layer 104 or the geometric shape of the optically effective surface 101 is now maintained, according to the invention, precisely because—as will be explained below—the deformable layer 104 was previously configured accordingly. This means that the hysteresis profile that is characteristic of the deformable layer 104 in the dependence "layer thickness vs. temperature" is set or manipulated such that, taking into consideration the concretely expected operating temperature of the optical element 100 in the optical system (e.g. in the projection lens), the deformation that is actively attained in the optical element 100 by applying the temperature field is maintained during further operation, that is to say no phase transition of the optical system takes place any longer at operating temperature.

Figure 2:
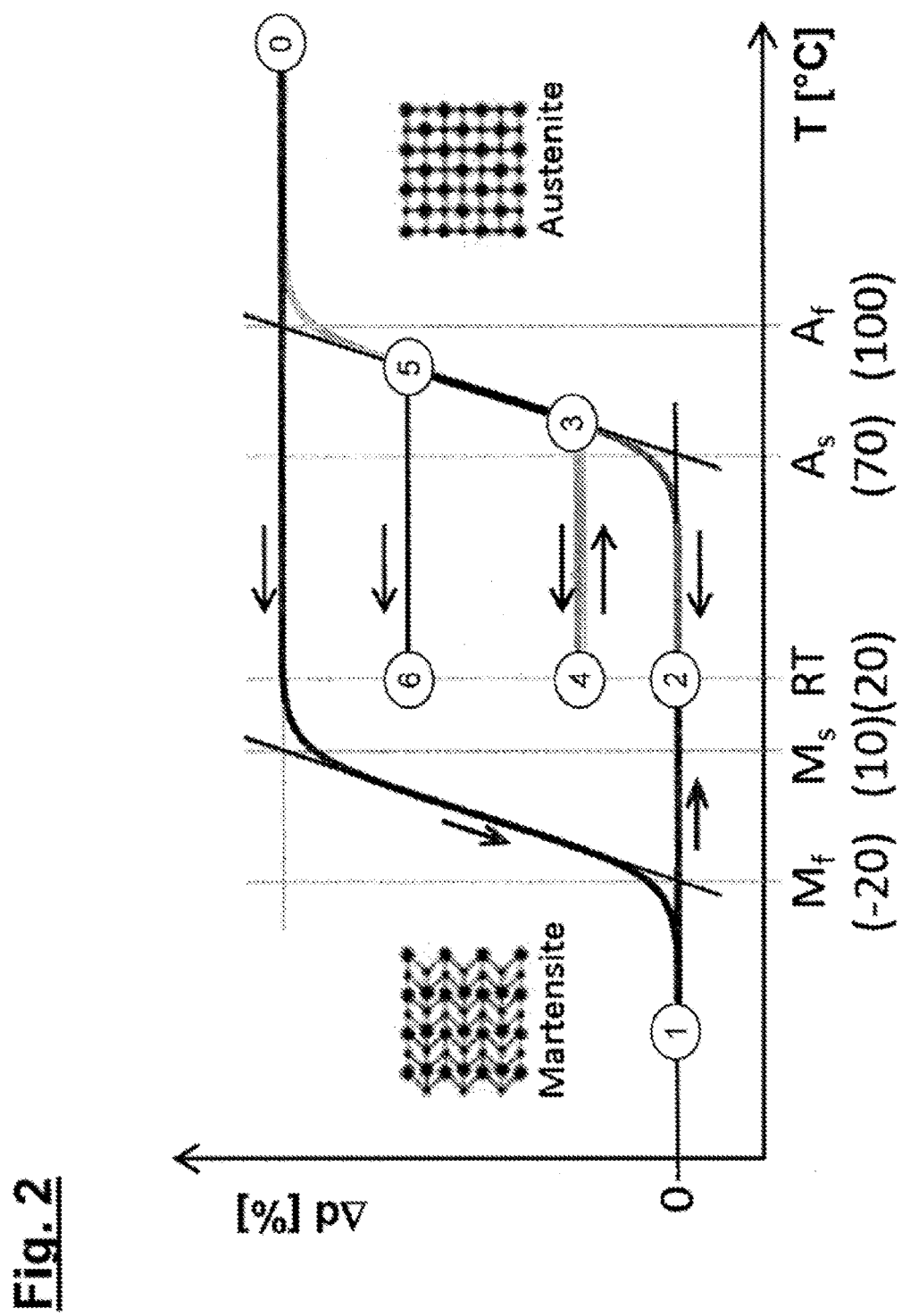
FIG. 2 shows a schematic illustration for elucidating a principle underlying the present invention.

FIG. 2 shows a schematic illustration for elucidating the principle underlying the present invention.

The diagram of FIG. 2 illustrates a hysteresis profile in the dependence "layer thickness vs. temperature" for an exemplary deformable layer 104 that is present in an optical element 100 according to the invention and consists of a Heusler alloy having a phase transition, occurring in dependence on the temperature, between a martensite phase and an austenite phase, wherein both the principle of the thermally induced layer thickness variation, which is produced in this layer 104 according to the invention, and the suitable configuration of the deformable layer 104, which was effected previously according to the invention, will be described below.

What is assumed here is that the Heusler alloy is deposited, for forming the deformable layer 104, on the substrate 102 at a relatively high temperature at which the Heusler alloy is in the austenite phase (position "0" along the hysteresis curve). Proceeding from this state, the optical element 100 or the layer 104 is cooled up to the complete transformation of the material of the layer 104 into the martensite phase (position "1" along the hysteresis curve), i.e. to below the saturation temperature that is valid herefor (which is denoted in FIG. 2 by "$M_f$" and for which an exemplary value $M_f$=−20° C. is assumed). The Heusler alloy forming the deformable layer 104 is here actively cooled, if necessary.

Once heating to temperature (in the example $R_T$=20° C.) is complete, a locally varying temperature field is immediately applied to the optical element 100, wherein the optical element 100 is heated at least regionally above the later operating temperature (which can be, e.g., 50° C. or more) with the result that, depending on the position, different temperatures and thus different local expansions or layer thickness changes are attained in accordance with the point on the hysteresis curve that is respectively reached during the heating (e.g. points "3" or "5" in FIG. 2).

Figure 3:
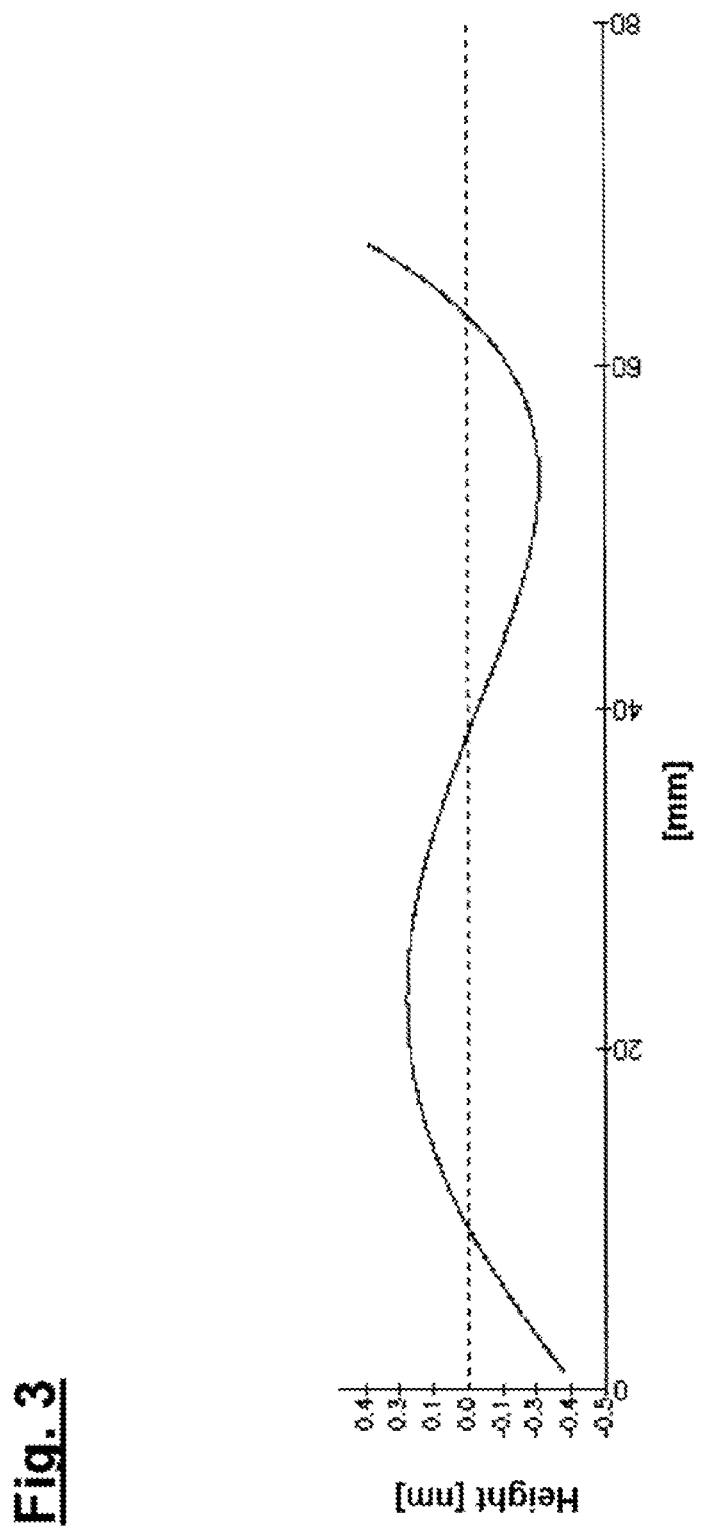
FIG. 3 shows a schematic illustration of an exemplary geometric shape of the optically effective surface of an optical element that is set during the method according to the invention.

These points "3" and "5" are located in each case on the increasing flank of the hysteresis curve, with the result that the local expansion or layer thickness change of the deformable layer 104 and thus the manipulation of the geometric shape of the optically effective surface 101 can be adjusted substantially continuously by way of the corresponding temperature setting. FIG. 3 shows a schematic illustration of a merely exemplary variation of the geometric shape of the optically effective surface 101 of an optical element 100 that is set during the method according to the invention.

After cooling for example back to room temperature (wherein for example the points "2," "4" or "6" are reached in FIG. 2), substantially no further local layer thickness change occurs anymore, with the result that the induced deformation is at least partially maintained or "frozen."

It should be pointed out that the temperatures given in FIG. 2 and the concrete profile of the hysteresis curve are merely examples, and, if required, can be adapted accordingly (for example for a higher operating temperature of the optical system).

What is taken advantage of according to the invention is that, during subsequent operation of the optical system in which the optical element 100 is placed, the respectively applicable transition temperatures for a further phase transition are no longer reached, with the result that the activity formation that is attained by the application of the temperature field to the optical element 100 is maintained during the further operation of the optical system. This is achieved by way of the fact that the optical element 100 is initially configured in a suitable manner such that the respective transition temperatures have a sufficient distance from the operating temperature (e.g. as shown in FIG. 2).

Configuring the optical element 100 initially comprises the above-described cooling to below the saturation temperature for the complete transformation into the martensite phase (position "1" along the hysteresis curve), and additionally also for example a suitable material selection, mixture and post-treatment of the Heusler alloy, as a result of which the respective transition temperatures (i.e. in FIG. 2 the use or saturation temperatures $A_s$, $A_f$, $M_s$ and $M_f$ that are applicable for the phase transition into the austenite phase or into the martensite phase) can be additionally manipulated or set in a suitable fashion depending on the operating temperature.

In concrete terms, the material of the deformable layer 104 can have, for example, nickel titanium (NiTi) as the Heusler alloy, wherein a shift of the above-mentioned use or saturation temperatures $A_s$, $A_f$, $M_s$ and $M_f$ to higher values can be achieved by way of doping or a partial replacement of nickel (Ni) with platinum (Pt) or palladium (Pd). In further embodiments, such manipulation of the above-mentioned use or saturation temperatures $A_s$, $A_f$, $M_s$ and $M_f$ can additionally or alternatively (to the conditioning of the layer directly after the position) also be achieved by performing a tempering process and/or applying an external magnetic field.

Furthermore, the form and magnitude of the hysteresis curve of FIG. 2 which describes the phase transition can be manipulated. Merely by way of example, the material of the deformable layer 104 can have nickel titanium (NiTi) as the Heusler alloy, wherein a broadening of the hysteresis curve or of the transition region between the respective phases can be achieved by way of doping or partial replacement of nickel (Ni) with hafnium (Hf) in order to manipulate the concrete profile of the layer thickness change between the above-mentioned use or saturation temperatures $A_s$, $A_f$, $M_s$ and $M_f$.

In further embodiments, it is possible to take advantage of the fact that both the form of the hysteresis curve describing the phase transition and the above-mentioned use or saturation temperatures $A_s$, $A_f$, $M_s$ and $M_f$ can be manipulated by applying an external magnetic field, e.g. to a Heusler alloy made of nickel manganese gallium (NiMnGa).

The invention is not limited to the one-time setting of a deformation. In embodiments—for example if the set deformation ultimately deviates from the desired one or if a modification of the deformation becomes necessary for other reasons—it is also possible for another transition of the Heusler alloy first into the austenite phase (position "0" according to FIG. 2) and subsequently into the martensite phase (position "1" in FIG. 2) (as a "reset," as it were) to occur in order to then attain a modified layer thickness change or active deformation of the optical element 100 by once again applying a temperature field. Furthermore, it is also possible, after the setting of a desired layer thickness change, if necessary (and also without the above-described "reset") e.g. after a temporary removal of the optical element 100 from the optical system, to apply a modified temperature field with the aim of a modified layer thickness change or deformation of the optical element 100.

The invention is furthermore not limited to the application of a locally varying temperature field to the thermally deformable layer. In further embodiments, the thermally deformable layer can also be configured such that an error in the optical system (e.g. an optical aberration or an imaging error of the overall system) is at least partially corrected by way of the deformation that is induced when the temperature field is applied. If, for example, an error of the entire optical system is known in advance, it is possible to work a corresponding locally varying doping into the thermally deformable layer or to perform a locally varying post-treatment (e.g. by tempering or applying a magnetic field) on the layer such that the desired correction can then also be attained by applying a homogeneous temperature field.

The construction and function of an optical element according to a further embodiment of the present invention will be described with reference to FIGS. 4 and 5.

Figure 4:
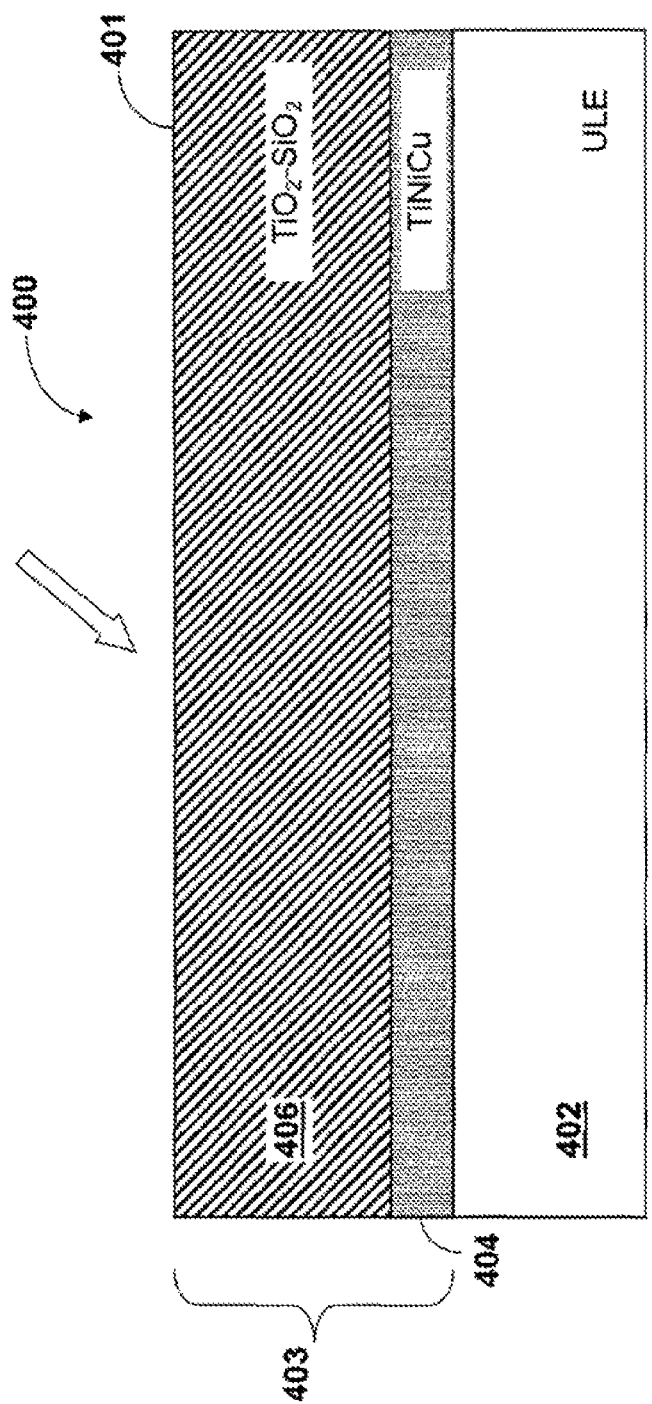
FIG. 4 shows a schematic illustration of the possible construction of an optical element according to a further embodiment of the invention.
Figure 5:
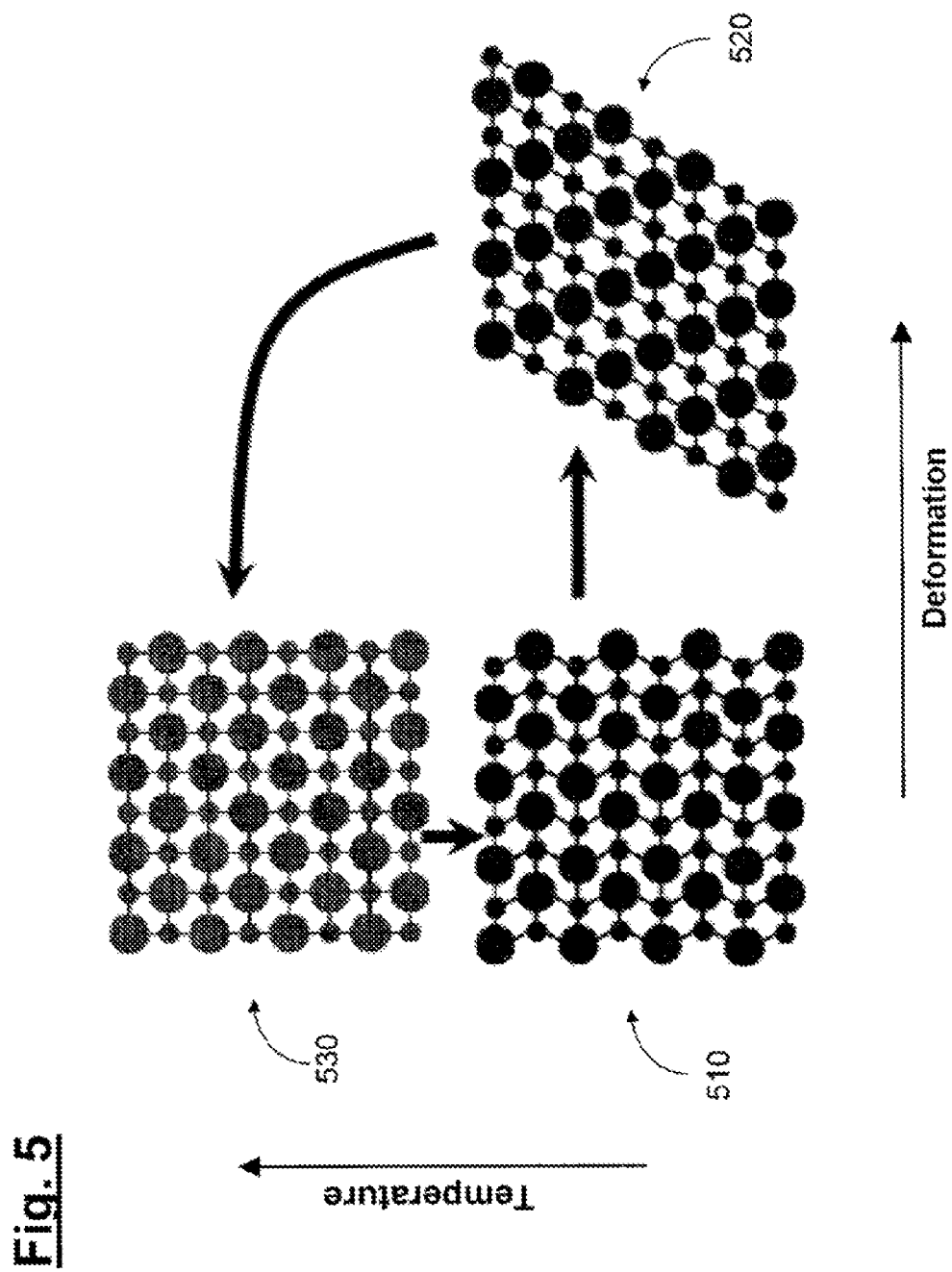
FIG. 5 shows a schematic illustration for elucidating a principle underlying the embodiment of FIG. 4.

According to FIG. 4, an optical element 400 according to the invention (in the example once again in the form of an EUV mirror) has on a substrate 402 (which can be made for example of ULE®) a layer system 403 which in turn has a reflection layer system 406. This reflection layer system 406 is, in the exemplary embodiment, configured in the form of a layer stack of $TiO_2$ and $SiO_2$ layers, but in further embodiments can also be configured in the form of a layer stack of molybdenum (Mo) and silicon (Si) layers, or also for example as a single layer (for example of ruthenium (Ru)).

The layer system 403 furthermore has, in accordance with FIG. 4, a layer 404 of a shape-memory alloy. In the exemplary embodiment, the latter is a titanium nickel copper alloy, with the respective proportions being able to be adapted or varied in suitable fashion. Merely by way of example, a composition $Ti_{54.9}Ni_{32.5}Cu_{12.6}$ is selected in the exemplary embodiment. In further embodiments, e.g. other titanium nickel alloys are able to be used, merely as an example titanium nickel palladium alloys. If appropriate, other elements can also be contained in the shape-memory alloy. The layer thickness of the layer 404 can, merely by way of example, line the range of (0.1 to 80) µm, with this layer thickness being constant preferably up to ±1%.

The layer system 403 can, in addition to the reflection layer system 406 and the layer 404 having the shape-memory alloy, also have further (functional) layers, if appropriate. In this case, the layer 404 having the shape-memory alloy can also be arranged at another location within the layer system 403. Furthermore, the layer 404 can be configured to cover the full area or merely be configured in region-wise or zone-wise fashion. The latter zone-wise configuration can be achieved for example by using a mask when applying the layer 404. A suitable method for plying the layer 404 is in particular magnetron sputtering. If necessary, an adhesion-promoting layer (e.g. of silicon nitride ($Si_3N_4$)) can be present between the layers (e.g. between the layer 404 and the reflection layer system 406).

The function of the shape-memory alloy in the optical system 400 of FIG. 4 will be explained below in more detail with reference to the schematic illustration of FIG. 5. In the illustration of FIG. 5, "510" denotes, merely with great simplification and by way of example, a lattice structure of the shape-memory alloy in the state of the low-temperature phase (martensite in twin structure). A deformation occurring during the operation of the optical system results in the lattice structure denoted by "520" ("detwinned martensite structure"). The relevant deformation can now be compensated for or be reversed according to the invention by way of effecting a transition into the high-temperature phase (austenite structure) by way of an introduction of energy into the shape-memory alloy and an associated temperature increase. The corresponding lattice structure in the thus attained high-temperature phase (austenite structure) is denoted in FIG. 5 with "530" and, as is schematically indicated, is associated with a reversion to the original shape, with this shape also being maintained after cooling, i.e. the transition to the grating structure 510 (martensite).

The introduction of energy into the shape-memory alloy can thus be used according to the invention to reverse an undesired deformation (which may be for example thermally induced during the operation of the optical element or of the optical system having this element or may be caused by mechanical stresses, for example as a result of any mounts that are present).

The previously mentioned introduction of energy into the shape-memory alloy or the layer 404 can be achieved for example by applying electric current (via electrodes that are not illustrated in FIG. 4), and in other embodiments by way of a direct introduction of thermal energy via a heat source or by way of laser irradiation.

In practice, for example the wavefront effect of the optical element 400 of FIG. 4 can be analyzed to determine any surface deformation of the optical element 400 that may occur during the operation of the optical system. In dependence on the occurrence of such a surface deformation of the layer system 403 including the layer 404, it is then possible for the above-described "activation" of the layer 404 to be effected by a corresponding introduction of energy, such that the layer 404 that is returning to its original shape, overall, reverses the surface deformation, and the surface shape of the optical element 400 and the wavefront effect thereof once again correspond to the ideal state before the undesired surface deformation, save for any residual errors. In embodiments, a differently formed wavefront image (on the basis of a Zernike polynomial fitting evaluation) can also be set, wherein a wavefront disturbance present at another location in the optical system can be at least partially compensated for by an active introduction of thermal energy into the shape-memory alloy. The optical element having the shape-memory alloy according to the invention can thus also be used as a correction element to actively compensate for a wavefront disturbance that is present at another location in the optical system by way of setting of a targeted deformation.

In embodiments, the layer 404 can be configured from the start such that a targeted influence on specific deformations with possibly one or more preferred directions can be achieved. The merely regional or zone-wise application of the layer 404, which has already been described above, is used for this purpose, in the case of which the layer 404 is structured suitably from the start (e.g. by using a mask in a sputtering method) in order to achieve, e.g. for taking into consideration specific preferred directions of the deformation, e.g. a higher bending moment in such directions and to introduce as little mechanical stress as possible in other regions.

Figure 6:
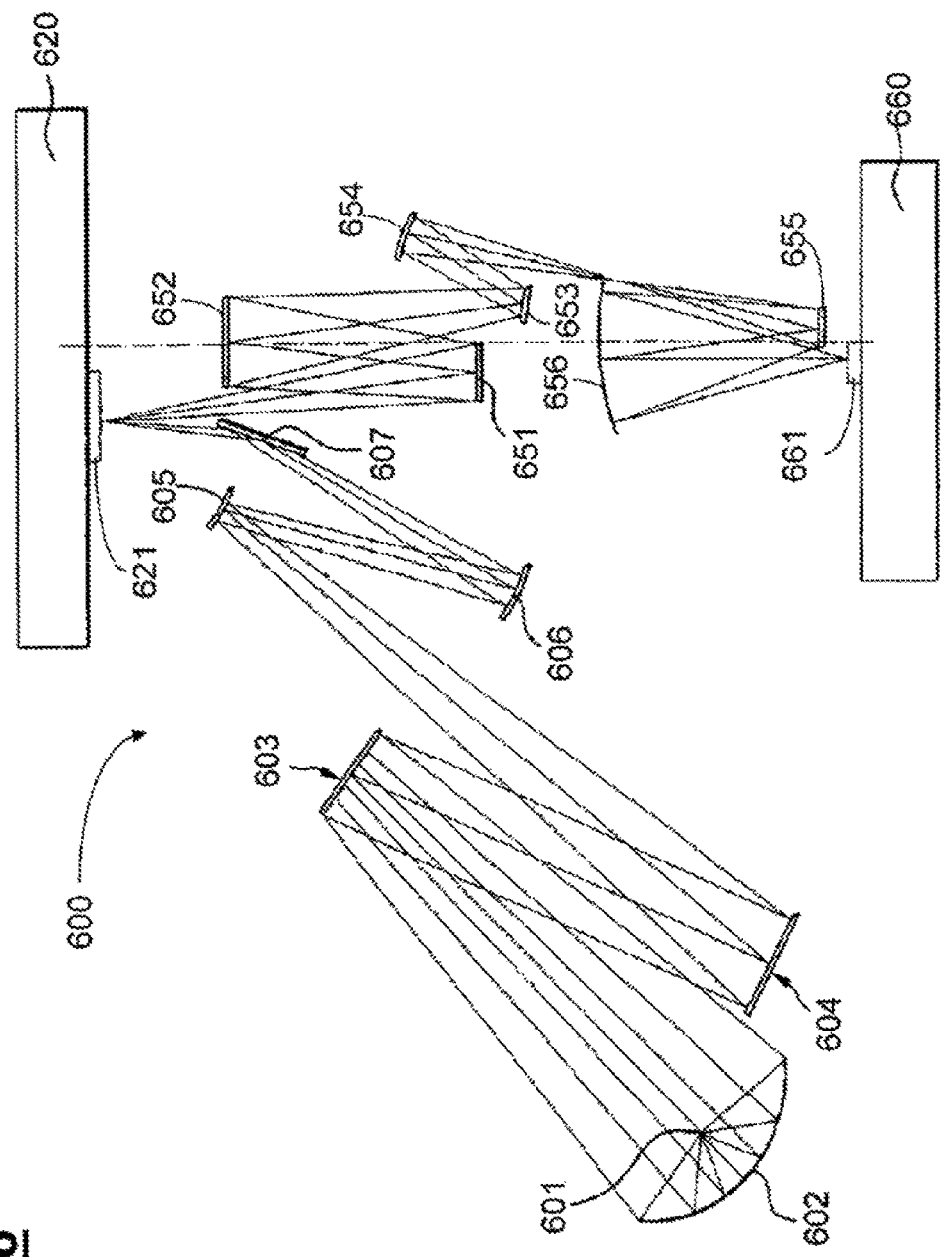
FIG. 6 shows a schematic illustration of the possible construction of a microlithographic projection exposure apparatus designed for operation in the EUV range.

FIG. 6 shows a schematic illustration of an exemplary projection exposure apparatus which is designed for operation in EUV and which can comprise an optical element according to the invention. In this context, the reflective optical element can in particular be one of the EUV mirrors present in the illumination device or in the projection lens of the projection exposure apparatus.

According to FIG. 6, an illumination device in a projection exposure apparatus 600 designed for EUV comprises a field facet mirror 603 and a pupil facet mirror 604. The light from a light source unit comprising a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident on it onto an object field in the object plane of a projection lens comprising six mirrors 651-656. At the location of the object field, a reflective structure-bearing mask 621 is arranged on a mask stage 620, said mask being imaged with the aid of the projection lens into an image plane, in which a substrate 661 coated with a light-sensitive layer (photoresist) is situated on a wafer stage 660.

Even though the invention has been described on the basis of specific embodiments, numerous variations and alternative embodiments are apparent to the person skilled in the art, e.g. by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. A method for producing an optical element for an optical system, comprising:
   a) providing a substrate;
   b) applying a layer system onto the substrate to form an optically effective surface of the optical element, wherein the layer system has a thermally deformable layer for manipulating a geometric shape of the optically effective surface;
   c) applying a temperature field to the optical element while heating the thermally deformable layer in at least a subset of regions of the layer to a relevant temperature that produces a layer thickness change and that is above a specified operating temperature of the optical system; and
   d) prior to applying the temperature field to the optical element, configuring the thermally deformable layer to at least partially maintain an induced deformation after the optical element has cooled to the specified operating temperature;

wherein the thermally deformable layer has a phase transition that has a temperature-dependent hysteresis profile such that an active deformation that is achieved by applying the temperature field to the optical element is maintained even absent the relevant temperature that produces the layer thickness change, and wherein applying the temperature field to the optical element is performed for correcting a production-related shape deviation before the optical element is mounted in the optical system.

2. The method as claimed in claim 1, further comprising: prior to applying the temperature field, ascertaining a geometric shape deviation from a predetermined geometric shape that the optically effective surface has at the specified operating temperature, wherein the temperature field following ascertaining the shape deviation is such that an induced deformation of the thermally deformable layer effects at least partial compensation of the ascertained shape deviation.

3. The method as claimed in claim 1, wherein the applied temperature field varies locally.

4. The method as claimed in claim 1, wherein the applied temperature field is homogeneous.

5. The method as claimed in claim 1, wherein the thermally deformable layer is configured such that an error in the optical system is at least partially corrected by the deformation induced when the temperature field is applied.

6. The method as claimed in claim 1, wherein the thermally deformable layer is made of a material which has, in dependence on the temperature, a phase transition between a martensite phase and an austenite phase.

7. The method as claimed in claim 6, wherein configuring the thermally deformable layer comprises cooling the thermally deformable layer to below a saturation temperature for the transition from the austenite phase into the martensite phase.

8. The method as claimed in claim 1, wherein the thermally deformable layer is formed from a Heusler alloy.

9. The method as claimed in claim 8, wherein the Heusler alloy is selected from the group containing nickel manganese gallium and nickel titanium.

10. The method as claimed in claim 1, wherein said configuring of the thermally deformable layer comprises targeted changing of the material composition of the thermally deformable layer.

11. The method as claimed in claim 1, wherein said configuring of the thermally deformable layer comprises applying an external magnetic field.

12. The method as claimed in claim 1, wherein said configuring of the thermally deformable layer comprises performing a tempering process.

13. The method as claimed in claim 1, wherein the thermally deformable layer is applied directly on the substrate.

14. The method as claimed in claim 1, wherein the optical element is a mirror.

15. The method as claimed in claim 1, wherein the optical element is configured for an operating wavelength of less than 30 nm.

* * * * *